United States Patent
Menter et al.

(10) Patent No.: US 7,296,054 B2
(45) Date of Patent: Nov. 13, 2007

(54) MODEL SIMULATION AND CALIBRATION

(75) Inventors: Patrick W. Menter, Dearborn, MI (US); Steven M. Toeppe, Beverly Hills, MI (US)

(73) Assignee: The MathWorks, Inc., Natick, MA (US)

( * ) Notice: Subject to any disclaimer, the term of this patent is extended or adjusted under 35 U.S.C. 154(b) by 890 days.

(21) Appl. No.: 10/351,046

(22) Filed: Jan. 24, 2003

(65) Prior Publication Data

US 2004/0148151 A1    Jul. 29, 2004

(51) Int. Cl.
*G06F 15/16*    (2006.01)

(52) U.S. Cl. .......................... 709/203; 703/2; 703/22; 717/138

(58) Field of Classification Search ................ 709/203; 703/2, 22; 717/138
See application file for complete search history.

(56) References Cited

U.S. PATENT DOCUMENTS

| | | | | |
|---|---|---|---|---|
| 6,041,263 | A * | 3/2000 | Boston et al. ................. | 700/32 |
| 6,223,144 | B1 * | 4/2001 | Barnett et al. ................. | 703/22 |
| 6,321,186 | B1 * | 11/2001 | Yuan et al. ..................... | 703/15 |
| 6,442,515 | B1 * | 8/2002 | Varma et al. .................. | 703/22 |
| 6,782,354 | B1 * | 8/2004 | Ikegami ......................... | 703/2 |
| 6,973,417 | B1 * | 12/2005 | Maxwell et al. ............... | 703/2 |
| 2002/0183990 | A1 * | 12/2002 | Wasynczuk et al. ........... | 703/2 |
| 2004/0098708 | A1 * | 5/2004 | Taruki et al. ................ | 717/138 |

OTHER PUBLICATIONS

The MathWorks, Inc., "Stateflow 5", www.mathworks.com 2002.

* cited by examiner

*Primary Examiner*—Jinsong Hu
(74) *Attorney, Agent, or Firm*—Lahive & Cockfield, LLP

(57) ABSTRACT

Simulate and calibrate a process by generating a modular representation of a process using modules and variables, each module representing a portion of the process, each variable representing an adjustable parameter of the process. One or more variables are set to specific values. Source code is generated to implement the process according to the modular representation, the code being generated without implementing portions of the process that are not executable when the one or more variables are set to the specific values. The source code is compiled into a machine code and executed to implement the process.

30 Claims, 5 Drawing Sheets

MODEL SIMULATION AND CALIBRATION

TECHNICAL FIELD

This invention relates to model simulation and calibration.

BACKGROUND

Software simulation tools allow interactive design of real-time systems. An example of such a simulation tool is Stateflow®, from Mathworks, Natick, Mass. As an example, in the design of a control system for a vehicle engine, a simulation model of the engine and a control process can be established to allow successive simulation in order to optimize the control process. The control process contains variables that represent parameters such as, sensor inputs and actuator settings of the engine. When performance of the control process is optimized, a code (for example, source code written in C programming language) suitable for an embedded system is generated so that it can be downloaded into a microcontroller installed in a vehicle.

To develop control software for use in microcontrollers of different vehicle lines, different control processes can be established, each control process having variables representing parameters specific to a particular vehicle. Another approach is to develop a general purpose control process that includes variables representing all of the parameters of the engines in the multiple vehicle lines. By developing a general control process that targets multiple vehicle lines rather than multiple control processes that each target one vehicle line, duplicate efforts in developing the multiple control processes can be reduced. Because the general control process is often more complex than a control process that targets a particular vehicle, the software code generated from such a general control process may also be larger.

SUMMARY

In general, in one aspect, the invention is directed towards a method of simulating and calibrating a process by generating a modular representation of a process using modules and variables, each module representing a portion of the process, each variable representing an adjustable parameter of the process, setting one or more variables to specific values, and generating code to implement the process according to the modular representation, the code being generated without implementing portions of the process that are not executable when the one or more variables are set to the specific values.

Implementations of the invention may include one or more of the following features. The code is generated by a first system and is suitable to be compiled into a machine code that is executable on a second system. The second system includes a microcontroller or a microprocessor. The process includes a control process implemented by the microcontroller or the microprocessor to control a device. The second system includes a digital signal processor. The process is implemented by the digital signal processor to process signals. The modular representation of the process includes an object oriented representation suitable for visualization and adjustment by a user. The code includes source code written in C programming language or Java™ programming language. The process includes a flow of events that includes branches, each branch representing an alternative subset of events, the selection of a branch depending on a value or values of one or more of the variables. The code includes a segment of code relating to a branch that is selected according to the one or more variables being set to the value or values and does not include code relating to a branch that is not selected based on the one or more variables being set to the value or values. Generating code includes determining whether the modular representation includes a control module that selects a first branch of modules when a first condition is satisfied, and selects a second branch of modules when a second condition is satisfied, and determining whether the first or second condition is satisfied when the one or more variables are set to the specific values. Generating code further includes generating code that implements the first branch of modules and not generating code that implements the second branch of module when the first condition is satisfied.

In general, in another aspect, the invention is directed towards a method of simulating and calibrating a process in a computer that includes specifying variables used to represent tunable parameters, setting properties for the specified variables, determining whether memory needs to be allocated to store the specified variables, configuring selected properties of a subset of the specified variables, and generating source code having macros written to define the subset.

Implementations of the invention may include one or more of the following features. The method includes generating a modular representation of a process using modules and the variables, each module representing a portion of the process, each variable representing a tunable parameter of the process. The source code is suitable to be compiled into a machine code that is executable on a microcontroller or microprocessor to implement the process.

In general, in another aspect, the invention is directed towards a method of simulating and calibrating a process that includes generating a modular representation of a process using modules and variables, each module representing a portion of the process, each variable representing an adjustable parameter of the process, for at least one of the variables, determining whether a memory space in a random access memory or a read only memory is allocated to store the variable during implementation of the process, and generating code to implement the process according to the modular representation, the code including a definition of the variable that is written according to the determination of whether a memory space in the random access memory or the read only memory is allocated.

Implementations of the invention may include one or more of the following features. The code is generated by a first system and is suitable to be compiled into a machine code that is executable on a second system. The second system includes a microcontroller or a microprocessor. The method includes for at least one of the variables, determining whether the variable is to be defined as a macro definition and assigned a specific value when the code is generated by the first system so that the specific value substitutes the variable in the code when the code is compiled into the machine code, and that no memory space in the random access memory or the read only memory is allocated to store the variable during implementation of the process. The code includes source code written in C programming language.

In general, in another aspect, the invention is directed towards a method implemented in a computer program application for simulating and calibrating a process, the method includes generating a modular representation of the process using modules and variables, each module representing a portion of the process, each variable representing an adjustable parameter of the process, setting one or more variables to specific values, and generating code to implement the process according to the modular representation, the code being generated without implementing portions of the process that are not executable when the one or more variables are set to the specific values.

Implementations of the invention may include the following feature. The code is generated by a first system and is suitable to be compiled into a machine code that is executable on a second system.

In general, in another aspect, the invention is directed towards a method for simulating and calibrating a process by generating a modular representation of a process using modules and variables, each module representing a portion of the process, each variable representing an adjustable parameter of the process, and generating code to implement the process according to the modular representation, the code being generated without implementing portions of the process that are not executable according to one or more properties of one or more variables.

Implementations of the invention may include one or more of the following features. A property of a variable includes a value assigned to the variable. A property of a variable indicates whether a memory space in a random access memory or a read only memory is allocated to store the variable when the process is implemented. The code is generated by a first system and is suitable to be compiled into a machine code that is executable on a second system.

In general, in another aspect, the invention is directed towards a method for simulating and calibrating an electronic circuit by generating a modular representation of the electronic circuit using modules and variables, each module representing a portion of the circuit, each variable representing an adjustable parameter of the circuit, setting one or more variables to specific values, and generating code to implement the circuit according to the modular representation, the code being generated without implementing portions of the circuit that are not used when the one or more variables are set to the specific values.

Implementations of the invention may include one or more of the following features. The code includes source code written in a hardware description language. The method includes configuring a programmable hardware according to the code in order to implement the electronic circuit. The programmable hardware includes a field programmable gate array. Generating code includes determining whether the modular representation includes a control module that selects a first branch of modules when a first condition is satisfied, and selects a second branch of modules when a second condition is satisfied, and determining whether the first or second condition is satisfied when the one or more variables are set to the specific values.

In general, in another aspect, the invention is directed towards a method for generating source code. The method includes providing a block diagram modeling environment for defining a process using blocks and parameters, receiving a definition of a block diagram model including a plurality of blocks and at least one parameter, the parameter having a memory storage attribute that may be modified by a user, and generating source code based on the block diagram model, the source code suitable for compiling into machine code, wherein during execution of machine code, the value of the at least one parameter is stored in either RAM or ROM, depending on the value of the memory storage attribute.

Implementations of the invention may include one or more of the following features. The source code includes code written in C or Java™ programming language. The process includes a control process implemented by a microcontroller or a microprocessor to control a device.

In general, in another aspect, the invention is directed towards a method for generating source code. The method includes providing a block diagram modeling environment for defining a process using blocks and parameters, receiving a definition of a block diagram model including a plurality of blocks and at least one parameter, the parameter having a memory storage attribute that may be modified by a user, and generating source code based on the block diagram model, the source code suitable for compiling into machine code, wherein during execution of machine code, the value of the at least one parameter is stored either as part of a coded instruction, or as non-instruction data, depending on the value of the memory storage attribute.

Implementations of the invention may include one or more of the following features. The source code includes code written in C or Java™ programming language. The process includes a control process implemented by a microcontroller or a microprocessor to control a device.

In general, in another aspect, the invention is directed towards a system for simulating and calibrating a process. The system includes a graphical user interface to allow a user to generate a modular representation of a process using modules and variables, each module representing a portion of the process, each variable representing an adjustable parameter of the process, the graphical user interface providing a functionality to allow specific values to be assigned to one or more variables, and a code generator to generate code that implements the process according to the modular representation, the code being generated without implementing portions of the process that are not executable when the one or more variables are set to the specific values.

Implementations of the invention may include one or more of the following features. The code is suitable to be compiled into a machine code that is executable on another system. The graphical user interface allows the user to determine whether a memory space in a random access memory or read only memory is allocated for the one or more variables when the machine code is executed. The code generator generates code that provides definition of the one or more variables according to the determination of whether a memory space is allocated. The code includes source code written in C programming language. The other system includes a microprocessor or a microcontroller.

In general, in another aspect, the invention is directed towards a system for simulating and calibrating an electronic circuit. The system includes a graphical user interface to allow a user to generate a modular representation of an electronic circuit using modules and variables, each module representing a portion of the circuit, each variable representing an adjustable parameter of the circuit, the graphical user interface providing a functionality to allow specific values to be assigned to one or more variables, and a code generator to generate code that implements the circuit according to the modular representation, the code being generated without implementing portions of the circuit that are not used when the one or more variables are set to the specific values.

Implementations of the invention may include one or more of the following features. The code includes source code written in a hardware description language. The source code is suitable for configuring a programmable hardware to implement the electronic circuit.

In general, in another aspect, the invention is directed towards a graphical user interface that includes a first interface to display a modular representation of a process, the modular representation being constructed with modules and variables, each module representing a portion of the process, each variable representing an adjustable parameter of the process, a second interface to allow a user to set one or more variables to specific values, and a third interface to display a code that implements the process according to the modular representation, the code being generated without implementing portions of the process that are not executable when the one or more variables are set to the specific values.

In general, in another aspect, the invention is directed towards a system for simulating a process and generating a source to implement the process. The system includes a block diagram modeling tool to allow a user to design a block diagram of a process using blocks and at least one parameter, the block diagram modeling tool including an interface to allow the user to set attributes of the at least one parameter while designing the block diagram to determine memory allocations associated with the at least one parameter when the process is implemented, and a source code generator to generate a source code according to the block diagram, the source code suitable to be compiled into a machine code, the code including at least one reference to a value of the at least one parameter.

Implementations of the invention may include one or more of the following features. The machine code is suitable for operating a microcontroller or a microprocessor. The process comprises a control process implemented by the microcontroller or the microprocessor to control a device. The interface allows the user to set an attribute of a parameter to a first mode such that the parameter value is stored in random access memory when the process is implemented and a second mode such that the parameter value is stored in read only memory but not in random access memory when the process is implemented. The interface allows the user to set the attribute of the parameter to a third mode in which the parameter value is set to a constant value and in which, if a particular block in the block diagram cannot be implemented when the parameter is assigned the constant value, then the source code generator does not generate code for the particular block.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
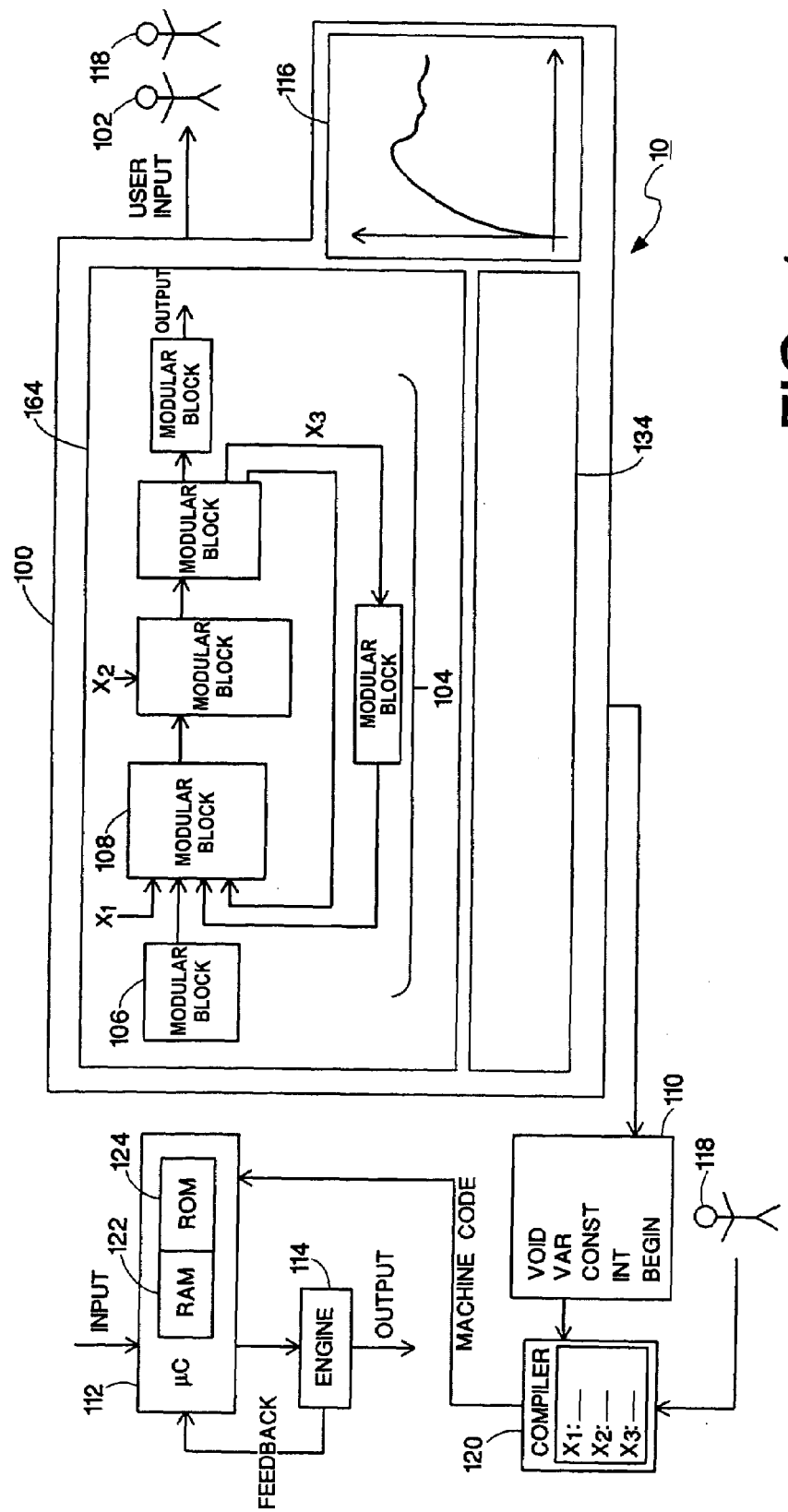
FIG. 1 is a block diagram of an exemplary system for simulating and calibrating a control process.

Referring to FIG. 1, a system 10 that can be used in an automotive development environment is shown. The system 10 includes a control systems engineer 102 interacting with an object oriented software simulation tool 100 to construct a control process model 104. The control process model 104 represents a model of a control process used by a microcontroller 112 to control a vehicle engine 114. Modular blocks, such as 106 and 108, within the control process model 104 represent portions of the control process to allow engineer 102 visualization of the control process. Variables, such as $x_1$, $x_2$, and $x_3$, are used to represent parameters of the control process. For example, variables $x_1$ and $x_2$ may represent inputs from sensors, and variable $x_3$ may represent an output of an actuator. Control process model 104 provides systems engineer 102 an ability to tune the process model 104 by repeated adjustments of process model 104 and simulations of the control process. When tuning of control process model 104 is completed, systems engineer 102 uses tool 100 to generate code 110. As an example, generated code 110 can be source code written in C or Java™ programming language. A compiler 120 compiles the code 110 into machine code that is downloaded into microcontroller 112. When the machine code is executed on microcontroller 112, the machine code causes microcontroller 112 to control engine 114 according the control process simulated by control process model 104. Tool 100 allows systems engineer 102 to determine which variables are set as constant variables, or set as constants that are written directly into the machine code (i.e., the values of the variables substitute for the variable names when the machine code is generated so that the machine code does not contain the variable names, just their values). This allows the machine code to be shorter and require less memory to run on the microcontroller 112, allowing microcontroller 112 to carry out the control process more efficiently.

Microcontroller 112 has a read-only memory (ROM) 124 for storing machine code and a random access memory (RAM) 122 for storing data and non-constant variables. ROM 124 can be implemented using electrically erasable programmable read only memory (EEPROM). Calibration engineer 118 experiments with different sensor and actuator settings for microcontroller 112 and engine 114. Based on the experiments, calibration engineer 118 can modify the generated code 110 or the control process model 104 to optimize the machine code that is run by microcontroller 112 to control engine 114.

Control process model 104 represents a general purpose control process that can be adapted for use by microcontrollers in different vehicle lines. The engines, sensors, and actuators in each vehicle line are different, so the parameters in a control process specific to a particular vehicle line can be different from the parameters in a control process for another vehicle line. As a model for simulating a general purpose control process, control process model 104 includes variables that represent all of the parameters in the control processes used for all of the vehicle lines. When control process model 104 is used to simulate a control process for a particular vehicle line, systems engineer 102 can set some variables to values that are specific to the vehicle line so that code 110 is tailored to the particular control process.

Figure 2:
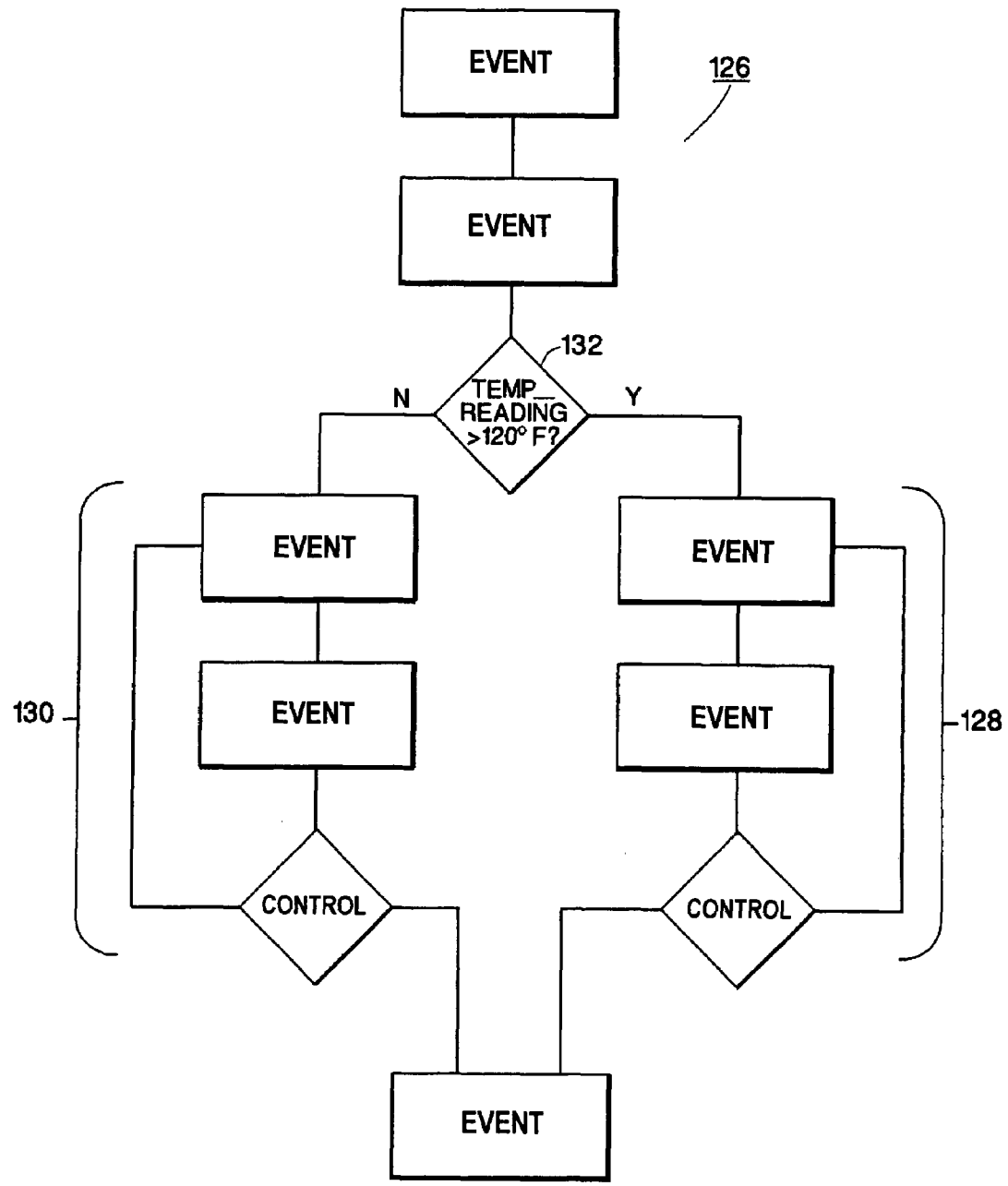
FIG. 2 is a flow diagram of a control process.

A general purpose control process can include a flow of events, where each event represents a portion of the control process, such as an action of an actuator, an input from a sensor, and a calculation of parameter values. The flow of events can include alternative branches, where one or a subset of the branches are selected and implemented depending on a value or values of one or more of the parameters in the control process. For example, FIG. 2 illustrates a control process 126 that includes a branch of events 128 and another branch of events 130. Each event is represented by a block. In this example, a temperature reading from a sensor determines which branch of events, branch 128 or branch 130, is selected. The temperature reading is represented by a variable, for example, temp_reading. In control process 126, a determination (132) is made as to whether the temperature reading exceeds a particular value, for example, 120° F. If the temperature exceeds the value, the branch of events 128 is selected. If the temperature does not exceed the value, the other branch of events 130 is selected.

Simulation tool 100 allows systems engineer 102 to set properties of variables in process model 104 to determine how the variables are defined in the generated code 110. A variable can be defined in code 110 such that, during implementation of the control process, memory space in RAM 122 is allocated to store the variable. This allows the variable to be modified throughout the control process. As an example, if a variable x is defined as "float x=1.0" in code 110, variable x is initially assigned a floating point value of 1.0, but x can still be changed at a later time in the control process.

A variable can be defined in code 110 such that, when compiled into machine code and stored into ROM 124 of microcontroller 112, memory space in ROM 124 is allocated to store the variable. The variable remains stored in ROM 124 and does not occupy RAM 122. The variable, referred to as a constant variable, is assigned a constant value and does not change throughout the control process. As an example, if a variable y is defined as "const float y=1.0" in code 110, variable y is initially assigned a floating point value of 1.0, and y will maintain this value throughout the control process. When a variable is declared to be a constant variable, calibration engineer 118 can still manually adjust the value of the constant variable in code 110 before it is compiled. This allows calibration engineer 118 an ability to fine-tune the control process without the need to modify process model 104.

A variable can be set by "macro definitions" that assigns a constant value to the variable in code 110. When code 110 is compiled into machine code, all occurrences of the variable in the code 110 are substituted by the constant value. The constant value is written into the machine (i.e., compiled) code. No memory space in RAM 122 or ROM 124 is allocated to such a variable. Such a variable is referred to as a macro defined variable. As an example, if a variable z is defined using "#DEFINE z 1.0" in code 110, when code 110 is compiled, all occurrences of the variable z are substituted by the value 1.0. No memory space, either in RAM 122 or ROM 124, is set aside to store the variable z. The value of the variable z (which is 1.0) is written directly into the machine code.

Figure 3:
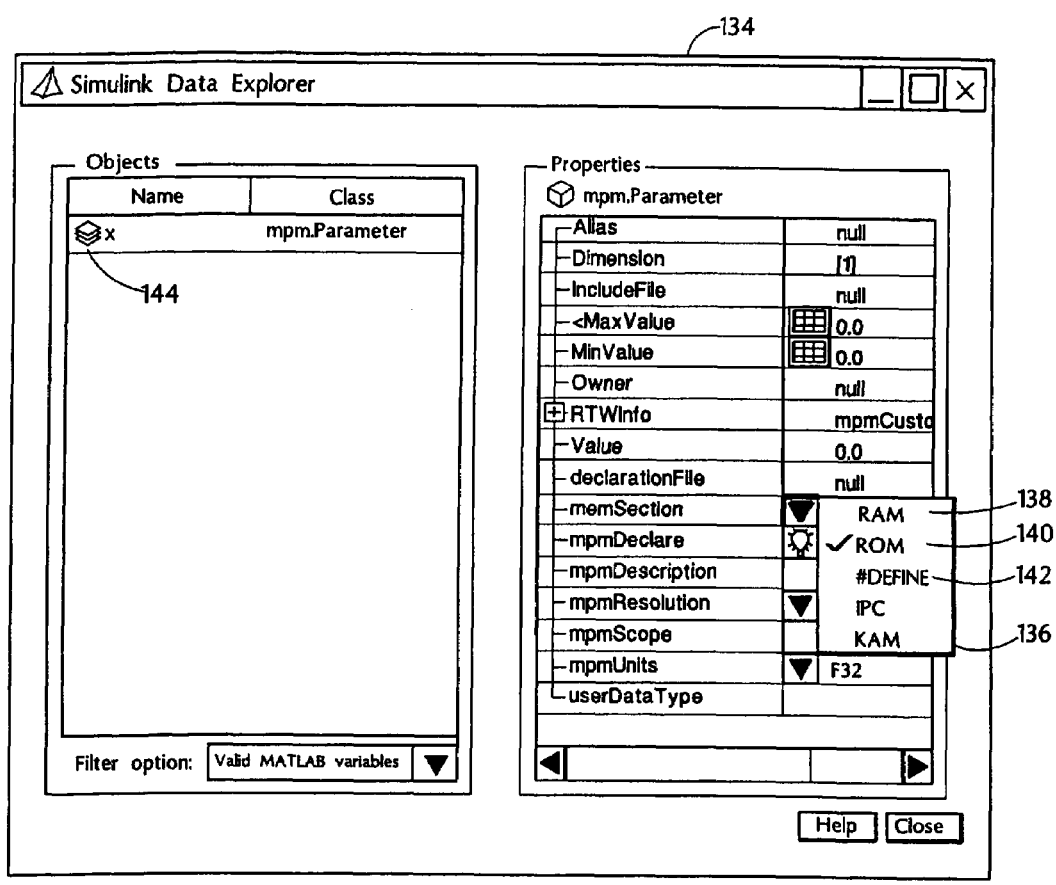
FIG. 3 is a graphical user interface.

Referring to FIG. 3, simulation tool 100 provides the user with a Graphical User Interface (GUI) 134 for setting properties of a variable. A pop-up menu 136 allows a user to select a "RAM" button 138, a "ROM" button 140, or a "#DEFINE" button 142 to define how memory is allocated for the selected variable. When RAM button 138 or ROM button 140 is selected, the variable is stored in RAM 122 or ROM 124, respectively, during the control process. When #DEFINE button 142 is selected, the variable is defined by a macro definition in code 110 so that during compilation, the value of the variable substitutes all occurrences of the variable and the value is written directly into the machine code. In the example shown in FIG. 3, ROM button 140 is selected for a variable x 144. This means that when the control process is implemented, the variable x will remain stored in ROM 124 and not change value throughout the control process.

When a variable is set to be defined using a macro definition (this is done by selecting #DEFINE button 142 in pop-up menu 136), simulation tool 100 examines process model 104 to determine which branches of the control process will not be selected and implemented when the variable is set to a particular value as defined by the macro definition. When generating code 110, simulation tool 100 determines which branches of events will not be implemented when the variable is set to the defined value. Code 110 will not contain segments of code that implement those branches.

For example, in control process 126 (FIG. 2), if the variable temp_reading has a value greater than 120° F., then the branch of events 130 is not implemented. Assuming that the variable temp_reading is set as a macro definition and assigned the value 150° F., when simulation tool 100 generates code 110, it does not include code used to implement the branch of events 130.

An advantage of simulation tool 104 is that after control process model 104 is established, calibration engineer 118 can easily "turn on" or "turnoff" sections of code 110 that are executed when certain variables have particular values. In tuning control process 126, calibration engineer 118 can set one or more variables as macro definitions (by selecting #DEFINE button 142 in pop-up menu 136). When code 110 is generated, the section of code that cannot be implemented when the variable is set to the assigned value is not generated. For example, when tuning a control process for a particular vehicle line, calibration engineer 118 may determine that the variable temp_reading should always be set to 250° F. and that it is not necessary to further fine-tune the value of temp_reading. The calibration engineer 118 selects #DEFINE button 142 so that variable temp_reading is set as a macro definition in software code 110. When temp_reading is set as a macro definition, simulation tool 110 does not generate sections of code that implement the branch of events 130 when simulation tool 100 generates code 110. This results in shorter code 110 (i.e., code 110 occupies less memory when stored), which can be compiled into shorter machine code (i.e., the machine code requires less memory to run) that runs more efficiently on microcontroller 112.

When calibration engineer 118 tunes the control process for another vehicle line, he may determine that the variable temp_reading should always be set to 105° F. Control process model 104 is configured (by selecting RAM button 138 or ROM button 140) so that code 110 includes sections of code that implement the branch of events 130 but not the branch of events 128. The section of code for implementing the branch of events 128 is said to be "turned off," and the section of code for implementing the branch of events 130 is said to be "turned on." By providing the ability to turn on or off sections of code, simulation tool 100 allows calibration engineer 118 to quickly calibrate the general purpose control process model 104 for particular vehicle lines to generate machine code that is shorter and runs more efficiently on microcontroller 112.

An example of a portion of a code for the control process represented by control process model 104 is shown as Program Gas Test 1 (see below). This example illustrates code that will result in variables being stored in RAM 122 or ROM 124 during implementation of the control process. Before the code for Program Gas Test 1 is generated, calibration engineer 118 selects ROM button 140 in GUI 134 to set variables engine_speed_const and gas_const as constant variables. For variables x and y, RAM button 138 is selected so that they remain changeable during implementation of the control process.

```
/* Program Gas Test 1 */
    const float engine_speed_const = 100.0F;
    const float gas_const = 2.154387F;
    float x = 0.0F;
    float y = 1.0F;
    void gas_test(void)
    {
      if engine_speed_const > 100.0F
      {
        x = engine_speed_const * y + ( gas_const * x);
      }
      else
      {
        x = (engine_speed_const + 100.0F) * y + ( gas_const
            * x);
      }
    }
```

When Program Gas Test 1 is compiled into machine code and executed on microcontroller 112, memory space in ROM 124 will be allocated to store variables engine_speed_const and gas_const. Calibration engineer 118 can adjust these two parameters and re-compile code 110 into machine code as he conducts experiments on a vehicle hosting microcontroller 112 and engine 114.

After experimenting with various hardware and/or software settings in the vehicle, calibration engineer 118 may decide that variable engine_speed_const should be set to a fixed value 112.0 F and that other parameters need to be adjusted. Calibration engineer 118 uses simulation tool 100 to change the property of engine_speed_const by selecting #DEFINE button 142 to set the variable as a macro definition. This will result in Program Gas Test 2.

```
/*Program Gas Test 2 */
    #define engine_speed_const 112.0 F
    const float gas_const=2.154387 F;
    float x=0.0 F;
    float y=1.0 F;
```

```
    void gas_test(void)
    {
        x = engine_speed_const * y + ( gas_const * x);
    }
```

A macro definition ("#define engine_speed_const 112.0 F") is generated for engine_speed_const. The macro definition for engine_speed_const is inlined as a preprocessor macro, i.e., compiler 120 will inline 112.0 F for all occurrences of engine_speed_const. When generating Program Gas Test 2, simulation tool 100 checks to see if there are segments of code that are unreachable (i.e., are not executed when the code is compiled into machine code and executed by microcontroller 112). If so, then that segment of code is eliminated in the code output by tool 100. In Program Gas Test 1, a segment of code in the "if-else" statement is unreachable when engine_speed_const is set to be 120 F because the expression "engine_speed_const>100.0 F" is always true. When generating Program Gas Test 2, the segment of code that is unreachable is eliminated. This results in a smaller code.

Comparing Program Gas Test 1 and Program Gas Test 2, executing Program Gas Test 2 requires less space in ROM 124 because it is not necessary to allocate memory for the engine_speed_const. The code for Program Gas Test 2 itself is also smaller because an unreachable segment is removed, hence less space in ROM 124 is required to store the code. In more complex examples, it is possible that removing segments of code will also eliminate the need for some variables that are used only in those removed segments of code. This will result in more savings in RAM 122 and/or ROM 124.

Eliminating code that is unreachable when engine_speed_const is set to 112.0 F allows calibration engineer 118 to experiment and tune other parameters. By turning off segments of code when certain parameters are hard set to constant values, more memory is freed up to store data and allow experimentation with other parameters.

At a later time, after tuning other parameters, calibration engineer 118 can experiment some more with engine_speed_ const. This is achieved by changing the property of engine_speed_const by selecting ROM button 140 for engine_speed_const. Simulation tool 100 then generates code 110 that has a segment similar to Program Gas Test 1. Calibration engineer 118 can then adjust the value of engine_speed_const in code 110 and run the compiled code in microcontroller 112 for further experimentation.

In the example described above, simulation tool 100 provides the ability to turn on or off different code sections related to processing of inputs or outputs of sensors and actuators related to a vehicle engine. A general purpose control process can be established to cover all variations of sensor and actuator configurations in multiple vehicle lines. During the development phase of a control process for a particular vehicle line, calibration engineer 118 may turn off certain code segments and only leave code segments related to sensors and/or actuators actually present in the particular vehicle line. The new code is smaller than the previous code while retaining the necessary functionality.

Calibration engineer 118 can turn off code segments related to certain sensors and actuators to reduce the overall complexity of interactions with the outside world. This makes it easier to calibrate certain parameters in the control process. Calibration engineer 118 can turn off code segments related to portions of the control process that are not used. This allows for scaling the complexity of the control process to just what the calibration engineer 118 desires.

Figure 4:
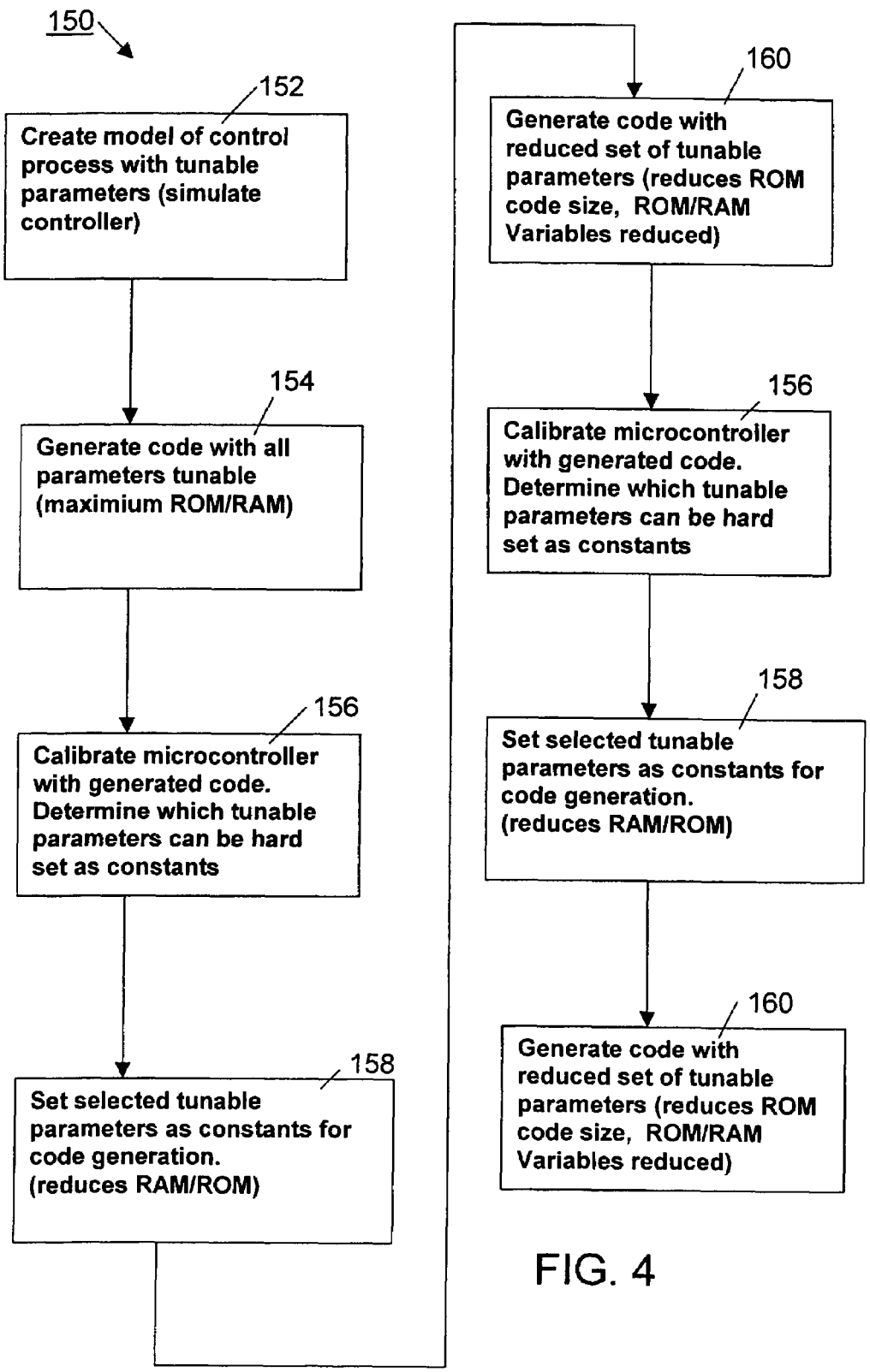
FIG. 4 is a flow diagram of a process for using a simulation tool to design source code for implementing a control process.

FIG. 4 is an example of a process 150 for using simulation tool 100 to design source code for implementing a control process. The source code is compiled into a machine code and run on microcontroller 112 to carry out the control process. Process 150 includes systems engineer 102 creating (152) a general purpose model of the control process with tunable parameters. The model is used to simulate the interactions between microcontroller 112 and engine 114. Variables are used to represent the parameters.

Systems engineer 102 uses simulation tool 100 to generate (154) code that allows tuning of all parameters. The code is generated such that all of the variables representing the parameters are adjustable. The variables are either stored in RAM 122 or ROM 124 as microcontroller 112 carries out the control process.

Calibration engineer 118 calibrates (156) microcontroller 112 with the generated code. After experimentation, calibration engineer 118 determines which tunable parameters does not need to be tuned and can be hard set as constants.

Calibration engineer 118 uses simulation tool 100 to set (158) macro definitions for the variables representing parameters that do not need to be tuned. Engineer 118 uses GUI 134 to adjust properties of the variables and selects the #DEFINE button 142 for the variables. Constant values are assigned to the variables.

Calibration engineer 118 uses simulation tool 100 to generate (160) source code 110 with a reduced set of tunable parameters. Segments of code relating to portions of the control process that are not carried out because certain variables are hard set to constant values are eliminated from the source code. The memory space in ROM 124 required to stored the machine code compiled from the source code is reduced. Because macro definitions are used for those variables, when the source code 110 is compiled, occurrences of the variables are replaced by the constant values in the macro definitions. No additional memory space in RAM 122 or ROM 124 is required to store those variables.

Calibration (156), setting (158), and generating (160) are repeated as calibration engineer 118 turns on and/or off certain code segments as different tunable parameters are set to their intended final values.

Process 150 allows for incremental reduction in the source code that is generated from a general purpose control process model 104 that can be easily reused and configured through the tunable parameters. The ability to turn on or off code segments in the source code increases the value of the control process model 104, which may require a large amount of development effort by systems engineer 102.

Without the ability to turn off code segments, a single, complex, and large source code may have to be maintained to support the flexibility required by the development process. The maintenance of such a large source code is costly and tedious. As the control process is further developed and more functionality is generated for the control process, the source code can to become larger and larger, which causes the machine code to also become larger. In order to support multiple vehicle lines, the machine code has to be large and complex, requiring more expensive microcontrollers with larger RAM and ROM. This means that in order to use a general control process model to support multiple vehicle lines, the microcontrollers for each vehicle line has to be more complex and expensive.

By using the technique of incremental reduction in source code, a general control process model can be generated to support multiple vehicle lines without causing the source code to bloat, neither requiring the microcontrollers for each vehicle line to be more complex and have more memory.

Figure 5:
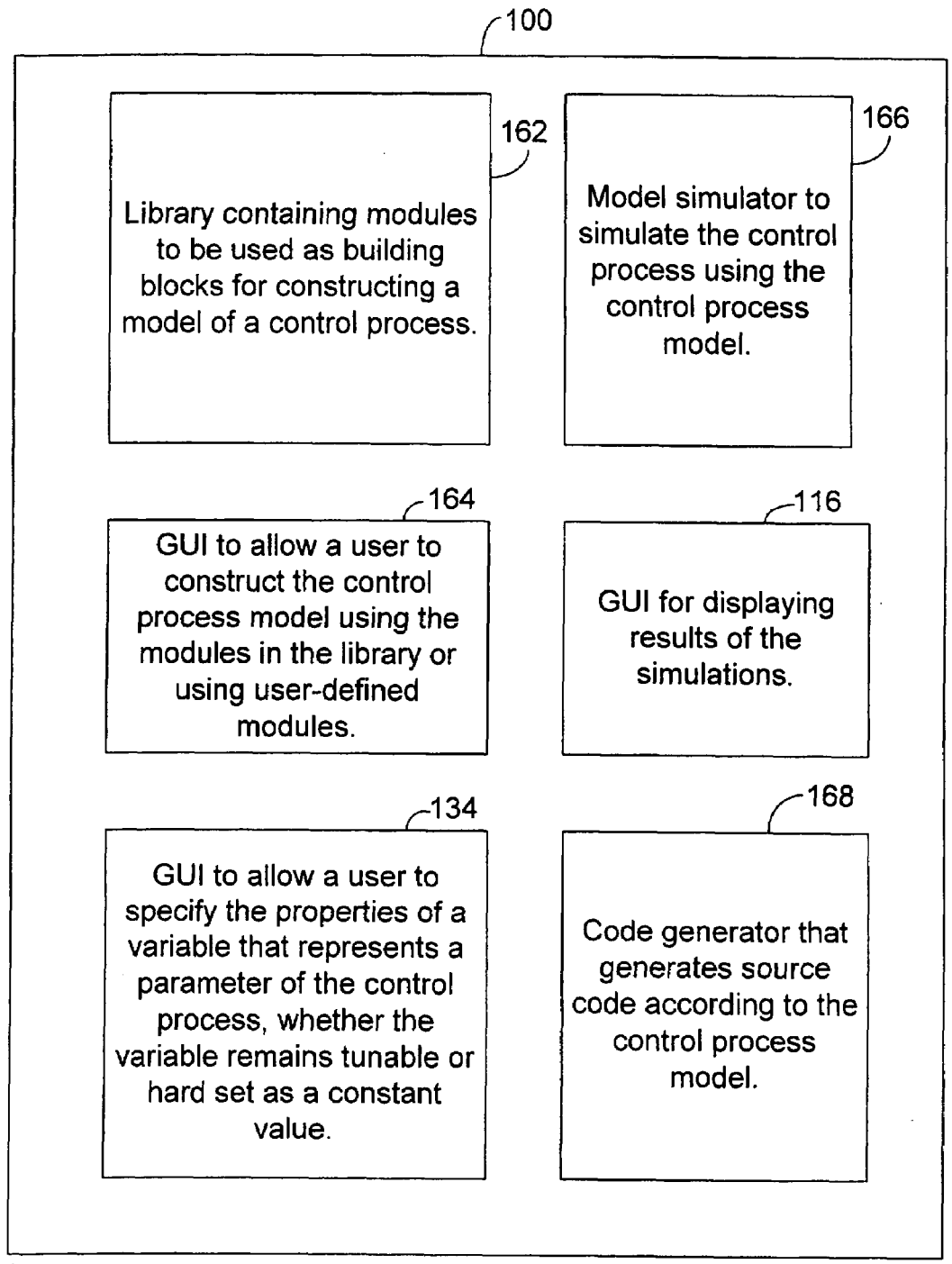
FIG. 5 is a block diagram of a simulation tool.

Referring to FIG. 5, simulation tool 100 includes a library 162 that has pre-defined modules, which are used as basic building blocks when constructing control process model 104. Simulation tool 100 includes a Graphical User Interface (GUI) 164 that allows a user to construct the model using the pre-defined modules in library 162 or using user-defined modules. GUI 164 allows the user to specify the inputs and outputs of the modules, and to define variables that represent various parameters in the model. Tool 100 includes a GUI 134 that allows the user to specify the properties of a variable, and determine whether the variable remains tunable (memory space in RAM or ROM is allocated to store the variable when a machine code compiled from the source code is executed), or whether the variable is set as a constant value (the variable is defined using a macro definition in the source code).

Simulation tool 100 includes a model simulator that allows a user to simulate the control process using the control process model 104. A GUI 116 displays the results of the simulation. Simulation tool 100 includes a code generator 168 that generates source code according to the control process model 104. The source code can be compiled by a compiler 120 to generate machine code that can be executed on microcontroller 112.

In the above description, a control process in a microcontroller to control an engine was used as an example. Simulation tool 100 can be used to generate models of other processes or systems. For example, a user can use simulation tool 100 to generate a general purpose model of a digital signal processing (DSP) system that processes input signals from various sources and generates outputs according to a signal processing algorithm. The general purpose model can be used to simulate a family of different digital signal processors, each having different input/output ports and processing capabilities. The general purpose model may have a large number of tunable parameters to provide flexibility in modeling each of the different digital signal processors. Tool 100 can be used to generate source code that can be compiled and executed on the digital signal processors to process signals according to the signal processing algorithm.

Using simulation tool 100, a user specifies variables used to represent the parameters that can be tuned. The user sets properties for those variables, and determines whether space in RAM or ROM needs to be allocated to store the variables. The user configures the properties of certain variables in the general purpose model so that when the source code is generated, macro definitions are written into the source code to define those variables. When the source code is compiled into machine code, those variables are replaced by constant values, and no memory space in RAM or ROM is required to store those variables. Segments of code that implement portions of the signal processing algorithm that are not reachable are turned off (i.e., such code segments are not generated in the source code). During the development phase of the DSP system, the user can easily turn on or off code segments related to certain parameters so as to make it easier to calibrate other parameters.

By providing the ability to incrementally reduce the memory requirement of the machine code generated from the source code derived from the general purpose model, the general purpose model can be easily reused and configured through the tunable parameters.

Another application of simulation tool 100 is in electronic circuit design. For example, a user can use simulation tool 100 to generate a general purpose model of an integrated circuit, such as an MPEG video encoder/decoder. The general purpose model can be used to simulate a family of MPEG encoder/decoder chips, each having different input/output ports and processing capabilities. The general purpose model may have a large number of tunable parameters to provide flexibility in modeling each of the different MPEG chips. The general purpose model may be used to simulate an IC used as an encoder, to simulate an IC used as a decoder, or to simulate an IC having a combination of encoder and decoder. The general purpose model can be used to simulate an MPEG chip used in a vehicle DVD player that need to solve particular jitter problems. The general purpose model can be used to simulate an MPEG circuitry used in a portable phone with reduced functionality to meet low power restraints.

The user utilizes tool 100 to generate code used to fabricate the integrated circuit having the desired functionality. For example, the code may be written in a hardware description language (HDL), such as Verilog HDL. An FPGA chip may then be programmed according to the HDL code. The user determines whether a parameter in the general purpose model remains tunable in the HDL code. The user determines whether a variable is hard set as a constant, and that code segments in the HDL code that are not reachable are turned off (i.e., these code segments are not generated in the HDL code). This results in a smaller HDL code that requires less space on the FPGA chip. During the development phase of the MPEG chip, the user can easily adjust the parameters and turn on or off code segments related to certain parameters so as to make it easier to calibrate the other parameters.

By providing the ability to incrementally reduce the complexity of the circuitry derived from the HDL code generated from a general purpose model, the general purpose model can be easily reused and configured through the tunable parameters.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

To provide for interaction with a user, the invention can be implemented on a computer system having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

A number of embodiments of the invention have been described. Nevertheless, it will be understood that various modifications may be made without departing from the spirit and scope of the invention. For example, code 110 may be written in a language targeted for a particular microcontroller 112. Compiler 120 and simulation tool 100 can be integrated in the same simulation environment. Simulation tool 100 need not provide a graphical user interface to allow the user to visualize the process. Rather, the user can write a script describe the model using high level descriptive language that describes the behavior of modules. The script is used to generate code 110 that is used as a source code that is later compiled into a machine code to be executed on microcontroller 112. In Program Gas Test 1 and Program Gas Test 2, an "if-else" control statement was used to illustrate a segment of code that is not reachable when a variable is set to a constant value.

Code 110 may contain other types of control statements, such as "switch (expression 1) {case value 1: action 1; case value 2: action 2}," "do {action 3} while (expression 2)," "while (expression 3) {action 4}." In the "switch-case" statement, if expression 1 is equal to value 1, then action 1 is performed, and action 2 is not performed. In the "do-while" or "while" statement, if expression 2 or expression 3 is not satisfied, then action 3 or action 4, respectively, will not be performed. Simulation tool 100 examines the modules that contain these control statements, and does not generate segments of code that implement branches of events that are never executed when certain variables are set as macro definition and assigned constant values, thereby "turning off" those segments of code. Accordingly, other embodiments are within the scope of the following claims.

What is claimed is:

1. A method comprising:
    generating a modular representation of a process using modules and variables, each module representing a portion of the process, each variable representing an adjustable parameter of the process;
    setting one or more variables to specific values; and
    generating code to implement the process according to the modular representation, the code being generated without implementing portions of the process that are not executable when the one or more variables are set to the specific values;
    wherein generating code comprises determining whether the modular representation includes a control module that selects a first branch of modules when a first condition is satisfied, and selects a second branch of modules when a second condition is satisfied; and determining whether the first or second condition is satisfied when the one or more variables are set to the specific values.

2. The method of claim 1 in which the code is generated by a first system and is suitable to be compiled into a machine code that is executable on a second system.

3. The method of claim 2 in which the second system comprises a microcontroller or a microprocessor.

4. The method of claim 3 in which the process comprises a control process implemented by the microcontroller or the microprocessor to control a device.

5. The method of claim 2 in which the second system comprises a digital signal processor.

6. The method of claim 5 in which the process is implemented by the digital signal processor to process signals.

7. The method of claim 1 in which the modular representation of the process comprises an object oriented representation suitable for visualization and adjustment by a user.

8. The method of claim 1 in which the code comprises source code written in C programming language.

9. The method of claim 1 in which the code comprises source code written in Java™ programming language.

10. The method of claim 1 in which the process comprises a flow of events tat includes branches, each branch representing an alternative subset of events, the selection of a branch depending on a value or values of one or more of the variables.

11. The method of claim 10 in which the code comprises a segment of code relating to a branch that is selected according to the one or more variables being set to the value or values and does not include code relating to a branch tat is not selected based on the one or more variables being set to the value or values.

12. The method of claim 1 in which generating code further comprises generating code that implements the first branch of modules and not generating code that implements the second branch of module when the first condition is satisfied.

13. A computer-implemented system comprising:
means for generating a modular representation of a process using modules and variables, each module representing a portion of the process, each variable representing an adjustable parameter of the process;
means for setting one or more variables to specific values; and
means for generating code to implement the process according to the modular representation, the code being generated without implementing portions of the process that are not executable when the one or more variables are set to the specific values;
wherein the means for generating code comprises means for determining whether the modular representation includes a control module that selects a first branch of modules when a first condition is satisfied, and selects a second branch of modules when a second condition is satisfied; and means for determining whether the first or second condition is satisfied when the one or more variables are set to the specific values.

14. The system of claim 13 in which the code is generated by a first system and is suitable to be compiled into a machine code that is executable on a second system.

15. A method comprising:
generating a modular representation of an electronic circuit using modules and variables, each module representing a portion of the circuit, each variable representing an adjustable parameter of the circuit;
setting one or more variables to specific values; and
generating code to implement the circuit according to the modular representation, the code being generated without implementing portions of the circuit that are not used when the one or more variables are set to the specific values;
wherein the means for generating code comprises means for determining whether the modular representation includes a control module that selects a first branch of modules when a first condition is satisfied, and selects a second branch of modules when a second condition is satisfied: and means for determining whether the first or second condition is satisfied when the one or more variables are set to the specific values.

16. The method of claim 15 in which the code comprises source code written in a hardware description language.

17. The method of claim 16, further comprising configuring a programmable hardware according to the code in order to implement the electronic circuit.

18. The method of claim 17 in which the programmable hardware comprises a field programmable gate array.

19. The method of claim 15 in which generating code comprises: determining whether the modular representation includes a control module that selects a first branch of modules when a first condition is satisfied, and selects a second branch of modules when a second condition is satisfied; and determining whether the first or second condition Is satisfied when the one or more variables are set to the specific values.

20. A system comprising:
a graphical user interface to allow a user to generate a modular representation of an electronic circuit using modules and variables, each module representing a portion of the circuit, each variable representing an adjustable parameter of the circuit, the graphical user interface providing a functionality to allow specific values to be assigned to one or more variables; and
a code generator to generate code that implements the circuit according to the modular representation, the code being generated without implementing portions of the circuit that are not used when the one or more variables are set to the specific values;
wherein the means for generating code comprises means for determining whether the modular representation includes a control module that selects a first branch of modules when a first condition is satisfied, and selects a second branch of modules when a second condition is satisfied; and means for determining whether the first or second condition is satisfied when the one or more variables are set to the specific values.

21. The system of claim 20 in which the code comprises source code written in a hardware description language.

22. The system of claim 21 in which the source code is suitable for configuring a programmable hardware to implement the electronic circuit.

23. A computer program product, tangibly stored on a computer-readable medium, for simulating and calibrating a process, comprising instructions operable to cause a programmable processor to:
generate a modular representation of a process using modules and variables, each module representing a portion of the process, each variable representing an adjustable parameter of the process;
set one or more variables to specific values; and
generate code to implement the process according to the modular representation, the code being generated without implementing portions of the process that are not executable when the one or more variables are set to the specific values;
wherein the code is generated by determining whether the modular representation includes a control module that selects a first branch of modules when a first condition is satisfied, and selects a second branch of modules when a second condition is satisfied; and determining whether the first or second condition is satisfied when the one or more variables are set to the specific values.

24. The computer program product of claim 23 in which the code is suitable to be compiled into a machine code that is executable on a machine.

25. Apparatus comprising a computer storage medium tangibly embodying program instructions for simulating and calibrating a process, the program instructions including instructions operable to cause a programmable processor to:
generate a modular representation of a process using modules and variables, each module representing a portion of the process, each variable representing an adjustable parameter of the process;
set one or more variables to specific values; and
generate code to implement the process according to the modular representation, the code being generated without implementing portions of the process that are not executable when the one or more variables are set to the specific values;
wherein the code is generated by determining whether the modular representation includes a control module that selects a first branch of modules when a first condition is satisfied, and selects a second branch of modules when a second condition is satisfied; and determining whether the first or second condition is satisfied when the one or more variables are set to the specific values.

26. The apparatus of claim 25 in which the code is suitable to be compiled into a machine code that is executable on a machine.

27. A graphical user interface comprising:
a first interface to display a modular representation of a process, the modular representation being constructed with modules and variables, each module representing a portion of the process, each variable representing an adjustable parameter of the process;
a second interface to allow a user to set one or more variables to specific values; and
a third interface to display a code that implements the process according to the modular representation, the code being generated without implementing portions of the process that are not executable when the one or more variables are set to the specific values;
wherein the code is generated by determining whether the modular representation includes a control module that selects a first branch of modules when a first condition is satisfied, and selects a second branch of modules when a second condition is satisfied: and determining whether the first or second condition is satisfied when the one or more variables are set to the specific values.

28. The graphical user interface of claim 27 in which the code is suitable to be compiled into a machine code tat is executable on a machine.

29. A computer program, tangibly stored on a computer storage medium, comprising instructions for causing a computer having a display to:
display a modular representation of a process, the modular representation being constructed with modules and variables, each module representing a portion of the process, each variable representing an adjustable parameter of the process;
display an interface to allow a user to set one or more variables to specific values; and
display a code that implements the process according to the modular representation, the code being generated without implementing portions of the process that are not executable when the one or more variables are set to the specific values;
wherein the code is generated by determining whether the modular representation includes a control module that selects a first branch of modules when a first condition is satisfied, and selects a second branch of modules when a second condition is satisfied; and determining whether the first or second condition is satisfied when the one or more variables are set to the specific values.

30. The computer program of claim 29 in which the code is suitable to be compiled into a machine code that is executable on a machine.

* * * * *